(12) United States Patent
Kim et al.

(10) Patent No.: US 7,328,413 B2
(45) Date of Patent: Feb. 5, 2008

(54) METHOD AND CIRCUIT FOR REDUCING LEAKAGE AND INCREASING READ STABILITY IN A MEMORY DEVICE

(75) Inventors: Hyung-il Kim, Saint Paul, MN (US); Jae-Joon Kim, Yorktown Heights, NY (US); Kaushik Roy, West Lafayette, IN (US)

(73) Assignee: Purdue Research Foundation, West Lafayette, IN (US)

( * ) Notice: Subject to any disclaimer, the term of this patent is extended or adjusted under 35 U.S.C. 154(b) by 413 days.

(21) Appl. No.: 11/066,402

(22) Filed: Feb. 25, 2005

(65) Prior Publication Data
US 2006/0206739 A1    Sep. 14, 2006

(51) Int. Cl.
*G06F 17/50* (2006.01)
*G11C 5/14* (2006.01)

(52) U.S. Cl. ............................ 716/1; 365/227; 365/229

(58) Field of Classification Search .................. 365/63, 365/149, 200, 211, 222, 226–227, 229, 236, 365/233; 716/1
See application file for complete search history.

(56) References Cited

U.S. PATENT DOCUMENTS 6,487,136 B2 * 11/2002 Hidaka ..................... 365/222

OTHER PUBLICATIONS

Amit Agarwal et al., "A Single-$V_t$ Low-Leakage Gated-Ground Cache for Deep Submicron", *IEEE Journal of Solid-State Circuits*, vol. 38, No. 2, Feb. 2003, pp. 319-328.

Evert Seevinck et al., "Static-Noise Margin Analysis of MOS SRAM Cells", *IEEE Journal of Solid-State Circuits*, vol. SC-22, No. 5, Oct. 1987, pp. 748-754.

Y. Nakagome, et al., "Review and future prospects of low voltage RAM circuits", *IBM J. Res. & Dev.*, vol. 47, No. 5/6, Sep./Nov. 2003, pp. 525-552.

Azeez J. Bhavnagarwala et al., "A Transregional CMOS SRAM with Single, Logic $V_{DD}$ and Dynamic Power Rails", *IEEE 2004 Symposium On VLSI Circuits Digest of Technical Papers*, pp. 292-293.

Terence B. Hook et al., "Noise Margin and Leakage in Ultra-Low Leakage SRAM Cell Design", *IEEE Transactions on Electron Devices Devices*, vol. 49, No. 8, Aug. 2002, pp. 1499-1501.

Azeez J. Bhavnagarwala et al., "A Pico-Joule Class, 1 GHz, 32 KByte x 64b DSP SRAM with Self Reverse Bias", *IEEE 2003 Symposium on VLSI Circuits Digest of Technical Papers*, pp. 251-252.

Kouichi Kanda et al., "90% Write Power-Saving SRAM Using Sense-Amplifying Memory Cell", *IEEE Journal of Solid-State Circuits*, vol. 39, No. 6, Jun. 2004, pp. 927-933.

Hiroyuki Yamauchi, et al., "A 0.8V/100MHz/sub-5m W-Operated Mega-bit SRAM Cell Architecture with Charge-Recycle Offset-Source Driving (OSD) Scheme", *IEEE 1996 Symposium on VLSI Circuits Digest of Technical Papers*, pp. 126-127.

* cited by examiner

*Primary Examiner*—Paul Dinh
(74) *Attorney, Agent, or Firm*—Barnes & Thornburg LLP (57) ABSTRACT

A device and method for increasing the read stability of a memory device includes sizing a sleep transistor according to a size ratio of the transistor relative to a driver transistor forming part of the memory device based on a static noise margin value. A leakage reduction circuit and method includes reducing a voltage via a current leakage of a transistor to track the leakage of the memory cells and generating a sleep signal if the voltage drops below a predetermined threshold.

12 Claims, 6 Drawing Sheets

METHOD AND CIRCUIT FOR REDUCING LEAKAGE AND INCREASING READ STABILITY IN A MEMORY DEVICE

BACKGROUND

The present disclosure relates generally to memory devices, and more specifically to techniques for reducing leakage and increasing read stability in memory devices One conventional technique for reducing the amount of current leakage in a memory device incorporates a sleep transistor into the memory circuitry. Such a sleep transistor is typically coupled to one or more memory cells, and is operable to place the memory cell(s) in a sleep mode, such as by turning off the memory cell.

SUMMARY

The present invention comprises one or more of the features recited in the appended claims and/or the following features which, alone or in any combination, may comprise patentable subject matter. A method may be provided for manufacturing a semiconductor memory device. The method may comprise determining a desired static noise margin value for a memory cell. A size ratio of a sleep transistor relative to one of a number of transistors comprising the memory cell based on the desired static noise margin value may be determined. The memory cell and the sleep transistor may be formed on a substrate with the sleep transistor electrically coupled to the memory cell and with the sleep transistor sized according to the size ratio.

The memory cell may be a static random access memory cell. The memory cell may be a six transistor static random access memory cell.

Determining a desired static noise margin value may include determining a desired static noise margin threshold value.

Determining a size ratio may include determining a size ratio of a physical width of the sleep transistor relative to a physical width of the one of a number of transistors. The one of a number of transistors may be a driver transistor of the memory cell. The size ratio may be a normalized size ratio. The size ration may be about 1.0. Alternatively, the size ratio may be less than 1.0. Forming the sleep transistor on the substrate may include forming the sleep transistor having a width determined by the size ratio. The sleep transistor may be a metal-oxide semiconductor transistor.

A memory device may comprise a number of memory cells and a sleep transistor coupled to a driver transistor of at least one of the number of memory cells. The sleep transistor may be configured to selectively place the at least one of the number of memory cells into a sleep mode. The sleep transistor may have a physical size based on a normalized size ratio of the sleep transistor relative to the drive transistor of the at least one of the number of memory cells.

Each of the number of memory cells may be a random access memory cell comprising six transistors.

The size ratio value is about 1.0. Alternatively, the size ratio may be less than 1.0. The sleep transistor may have a physical width determined according to the size ratio value.

A leakage reduction circuit for reducing current leakage in a memory cell may have a sleep transistor coupled thereto. The sleep transistor may be responsive to a sleep signal to place the memory cell in a sleep mode to reduce the current leakage of the memory cell. The leakage reduction circuit may comprise a voltage charge circuit, a voltage reduction circuit, a comparator circuit and a synchronization circuit.

The voltage charge circuit may produce a first voltage. The voltage reduction circuit may be coupled to the voltage charge circuit. The voltage reduction circuit may reduce the first voltage based on a leakage current. The comparator circuit may be coupled to the voltage charge circuit and to the voltage reduction circuit. The comparator circuit may compare the first voltage to a reference voltage and produce an output signal if the first voltage is lower than the reference voltage. The synchronization circuit may be coupled to the comparator circuit. The synchronization circuit may have an input receiving the output signal. The synchronization circuit may produce the sleep signal based on the output signal and a clock signal.

The voltage charge circuit may have an input receiving the sleep signal produced by the synchronization circuit. The voltage charge circuit may be configured to produce the first voltage in response to the sleep signal. The voltage charge circuit may include an electrical switch producing the first voltage in response to a delayed representation of the sleep signal. The voltage charge circuit may include a delay circuit, a NAND gate and a transistor. The delay circuit may have an input receiving the sleep signal and an output producing a delayed sleep signal. The NAND gate may have a first input receiving the sleep signal, a second input receiving the delayed sleep signal, and an output producing a biasing signal. The transistor may have a control input receiving the delayed sleep signal, a biasing signal input receiving the biasing signal, and an output producing the first voltage.

The voltage reduction circuit may include a transistor producing the leakage current. The transistor may be a metal oxide semiconductor transistor. The transistor may have an input receiving a bias voltage. The bias voltage may bias the transistor in a sub-threshold region.

The comparator circuit may include an operational amplifier configured as a comparator.

The leakage reduction circuit may further include a number of capacitance devices for stabilizing the first voltage. The number of capacitance devices may include a number of transistors. Alternatively or additionally, the number of capacitance devices may include a number of capacitors.

The synchronization circuit may include a flip-flop having a signal input receiving the output signal produced by the comparator circuit, a clock input receiving the clock signal and an output producing the sleep signal. The flip-flop may be a D-type flip-flop.

A method may be provided for reducing the current leakage of memory device having a sleep transistor coupled thereto. The sleep transistor may be responsive to a sleep signal to place the memory device in a sleep mode to reduce the current leakage of the memory device. The method may comprise providing a first voltage. The first voltage may be reduced based on a leakage current. An output signal may be generated if the first voltage is below a predetermined threshold. The sleep signal may be generated based on the output signal.

Providing a first voltage may include providing the first voltage based on a previously generated sleep signal. The leakage current may be produced by a transistor biased in a sub-threshold region. Generating the sleep signal may include generating a sleep pulse. Generating a sleep pulse may include generating a periodic sleep pulse. Generating the sleep signal may alternatively or additionally include generating a clock-synchronized sleep signal.

An SRAM device may comprise a number of memory cells, a sleep transistor and a leakage reduction circuit. The sleep transistor may be electrically coupled to at least one of the number of memory cells. The sleep transistor may be responsive to a sleep signal to selectively place the at least one of the number of memory cells into a sleep mode. The leakage reduction circuit may have a transistor biased in a sub-threshold region. The transistor may produce the sleep signal based on a leakage current produced by the transistor.

A method may be provided for reducing current leakage in a SRAM device. The SRAM device may have a sleep transistor responsive to a sleep signal to selectively place a number of memory cells of the SRAM device in a sleep mode to reduce the current leakage of the SRAM device. The method may comprise providing a first voltage, reducing the first voltage and generating a sleep signal. The first voltage may be reduced based on a leakage current of a transistor biased in a sub-threshold region. The sleep signal may be generated if the first voltage falls below a predetermined threshold.

The above and other features of the present disclosure, which alone or in any combination may comprise patentable subject matter, will become apparent from the following description and the attached drawings.

BRIEF DESCRIPTION OF THE DRAWINGS

The detailed description particularly refers to the following figures, in which.

DETAILED DESCRIPTION OF THE DRAWINGS

While the concepts of the present disclosure are susceptible to various modifications and alternative forms, specific exemplary embodiments thereof have been shown by way of example in the drawings and will herein be described in detail. It should be understood, however, that there is no intent to limit the concepts of the present disclosure to the particular forms disclosed, but on the contrary, the intention is to cover all modifications, equivalents, and alternatives falling within the spirit and scope of the disclosure.

Figure 1:
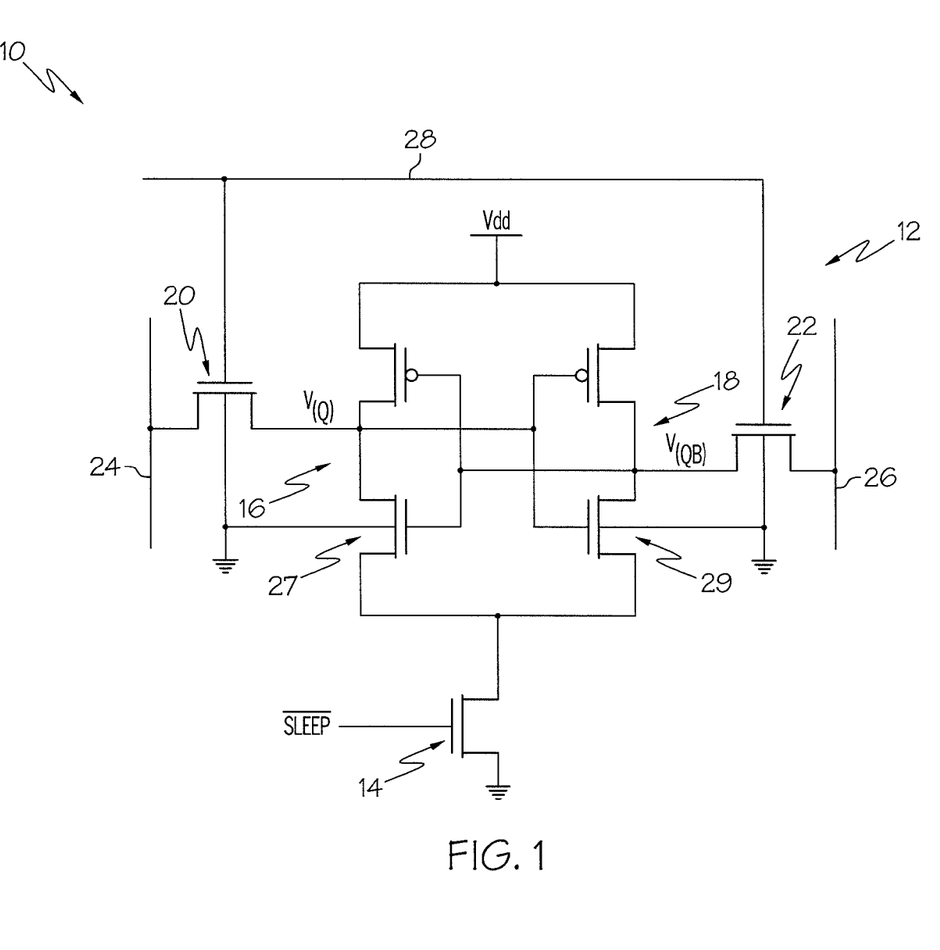
FIG. 1 is an illustrative schematic of a six transistor SRAM memory cell having a sleep transistor coupled thereto.

Referring now to FIG. 1, a memory device 10 having an increased read stability includes a number of memory cells 12 and at least one sleep transistor 14. Although the memory device 10 illustrated in FIG. 1 is a static random access memory (SRAM) device, it should be appreciated that the methods and devices disclosed herein are applicable to other types of memory devices, applications, and implementations. Additionally, although the memory cell 12 is illustrated as a six-transistor memory cell, the methods and devices disclosed herein may be applicable to other types of memory cells including, but not limited to, four transistor memory cells.

The memory cell 12 includes two cross-coupled inverters 16, 18 and access transistors 20, 22. The inverters 16, 18 include two transistors each, one n-type and one p-type. In particular, each inverter 16, 18 includes a n-type driver transistor 27, 29, respectively. Illustratively, the transistors included in each of the inverters 16, 18 and the access transistors 20, 22 are metal-oxide semiconductor field effect transistors (MOSFETs), but in other embodiments other types of transistors may be used. The inverters 16, 18 are coupled on a supply side to a power supply voltage, Vdd, and on a reference side to the drain terminal of the sleep transistor 14. The inverters 16, 18 are also each coupled to the drain terminals of the access transistors 20, 22. The source terminal of the access transistor 20 is coupled to a BIT line 24 and the source terminal of the access transistor 22 is coupled to a notBIT line 26. The gate terminals of the access transistors 20, 22 are coupled to a WORD line 28. The source terminal of the sleep transistor 14 is coupled to supply reference. The sleep transistor 14 may be coupled to multiple memory cells 12. In one particular embodiment, the sleep transistor 14 is coupled to each memory cell 12 of the memory device 10.

In operation, bit data is stored in the inverters 16, 18 of the memory cell 10. The bit data may be accessed or overwritten via the access transistors 20, 22. To do so, the WORD line 28 is used to bias, or turn on, the access transistors 20, 22. Data can then be written to the BIT line 24 and notBIT line 26 to store the bit data in the inverters 16, 18. Alternatively, bit data previously stored in the inverters 16, 18 may be read using the lines 24, 26.

Because the access transistors 20, 22 and/or inverters 16, 18 may leak current even when the memory cell 12 is not being accessed, the sleep transistor 14 is used to place the memory cell in a sleep mode or otherwise turn off the memory cell. To do so, a sleep signal, notSLEEP, is applied to the gate terminal of the sleep transistor 14. The sleep signal unbiases, or turns off, the sleep transistor 14. When the sleep transistor 14 is so unbiased, the virtual reference voltage of the inverters 16, 18 is raised generating a negative gate-to-source voltage in the access transistors 20, 22. A negative gate-to-source voltage in the access transistors 20, 22 reduces their current leakage. If the data contained in the memory cell is to be read, the notSLEEP signal is removed and the sleep transistor 14 is biased or turned on. In the biased state, the sleep transistor 14 provides a virtual reference voltage for the inverters 16, 18.

The sleep transistor 14 is selected and/or designed to improve read stability of the memory cell(s) 12 and the memory device 10. A common metric used to measure the read stability of a memory cell is the static noise margin of the memory cell. The static noise margin is the minimum DC noise voltage required to flip the state of a memory cell (i.e., alter or change the bit data stored in the memory cell). Memory devices having sleep transistors may have an increased static noise margin compared to conventional memory devices without sleep transistors.

Figure 2:
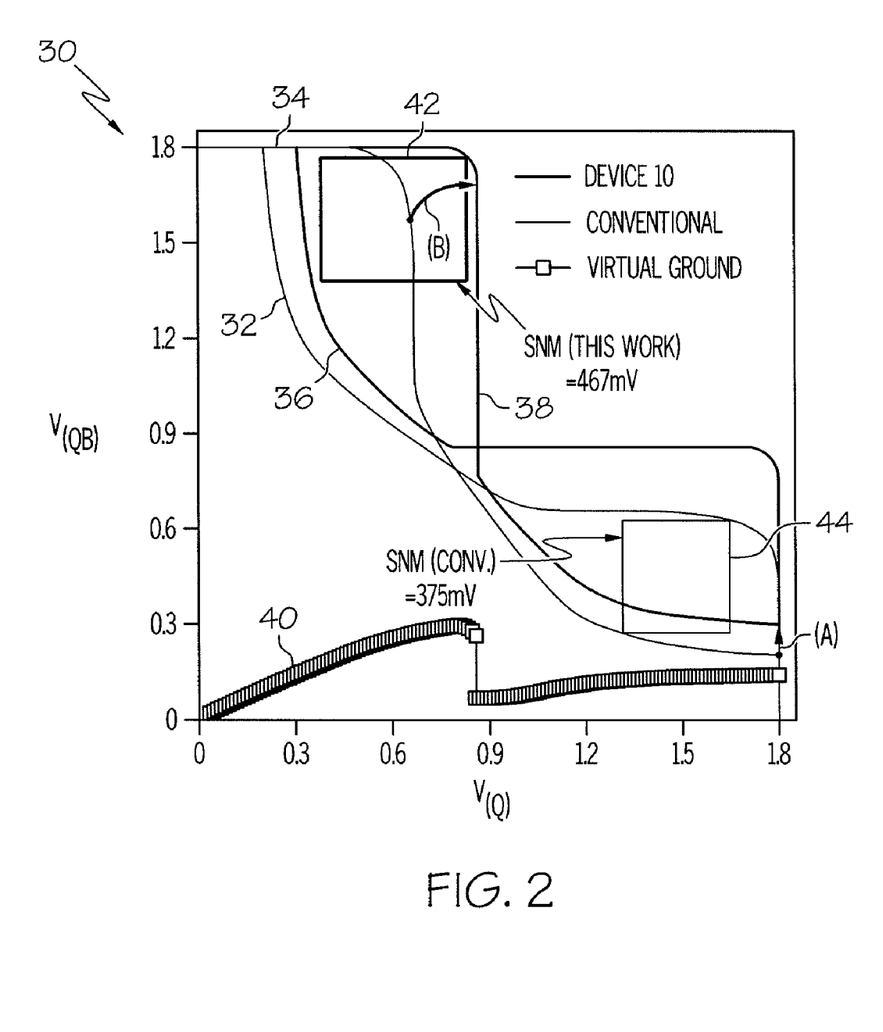
FIG. 2 is a butterfly graph of the voltage transfer characteristics of the memory cell of FIG. 1 and a memory cell without a coupled sleep transistor.

Referring now to FIG. 2, a butterfly graph 30 illustrating the voltage transfer characteristics of a six transistor SRAM with and without a sleep transistor is shown. The abscissa (i.e., x-axis) of the graph 30 is the data voltage, V(Q), of the memory cell 12 measured at the drain terminal of the access transistor 20 (see FIG. 1). The ordinate (i.e., the y-axis) of the graph 30 is the data voltage, V(QB), measured at the drain terminal of the access transistor 22 (see FIG. 1). Graph lines 32, 34 illustrate the voltage characteristics of a conventional six-transistor SRAM memory cell without a sleep transistor. Graph lines 36, 38 illustrate the voltage characteristics of a six-transistor SRAM memory cell having a sleep transistor coupled thereto. The static noise margin of each memory cell is illustrated on the graph 30 as the maximum width of an enclosed square in the superimposed voltage transfer curves of V(Q) and V(QB). A larger square denotes a better read stability. As discussed above, the sleep transistor generates an increase in the virtual ground voltage of the access transistors 20, 22. The increase in virtual ground voltage causes V(QB) at V(Q)=1.8 v to rise at point A of the graph 30. Although this shift in the butterfly curve may slightly degrade the read static noise margin, the increase in DC gain at point B of the graph 30 results in a greater overall improvement in the read static noise margin for a memory cell having a sleep transistor of about 25%. The read static noise margin increase at point B prevails over the effect at point A due to the difference in the rise of the virtual ground voltage under different V(Q) biases. As illustrated in the graph 30, the virtual ground voltage, line 40, rises much higher at the center of the graph 30 (i.e., where V(Q) equals about 0.8 volts and V(QB) equals about 1.8 volts) compared to the far right side of the graph 30 (i.e., where V(Q) equals about 1.8 volts and V(QB) equals about 0.3 volts). Because the rise in virtual ground voltage line 40 at the center of the graph 30 causes the shift at point B and the rise in the virtual ground voltage line 40 toward the right side of the graph 30 causes the shift at point A, the increase in the static noise margin at point B is more dominant due to the higher rise in the virtual ground voltage line 40 at the center of the graph 30 (i.e., where V(Q) equals about 0.8 volts and V(QB) equals about 1.8 volts). Accordingly, the maximum width of an enclosed square 42 for the memory cell having a sleep transistor is greater, and, therefore, has a better static noise margin, than the width of the enclosed square 44 for the memory cell without a sleep transistor.

To improve the read stability of the memory cell 12, the sleep transistor 14 may be designed and/or selected based on a static noise margin value such as a predetermined threshold or specific desirable static noise margin value. To do so, the sleep transistor 14 is sized (i.e., the physical footprint of the transistor on the substrate is sized) based on the size of one of the driver transistors such as driver transistor 29 The size of the sleep transistor 14 and the driver transistor 29 can be based any one of a number of dimensional values of the transistors. In one particular embodiment, the size of the sleep transistor 14 and the driver transistor 29 is determined by the physical width of the transistor on the wafer substrate.

To size the sleep transistor 14 to reduce the read static noise margin, a size ratio, Gsize, may be selected or determined for the transistor 14. The size ratio, Gsize, is the ratio of the size (e.g., the width of the transistor on the wafer substrate) of the sleep transistor 14 to the size of one of the driver transistors, such as driver transistor 29. The size ratio for the sleep transistor 14 is selected based on the read static noise margin of the size ratio. Once a size ratio having a desirable static noise margin value is selected or determined, the size of the sleep transistor 14 may then be determined based on the size ratio. The sleep transistor 14 may be fabricated on the substrate wafer to have a size (e.g., a physical width) in accordance with the size ratio.

Figure 3:
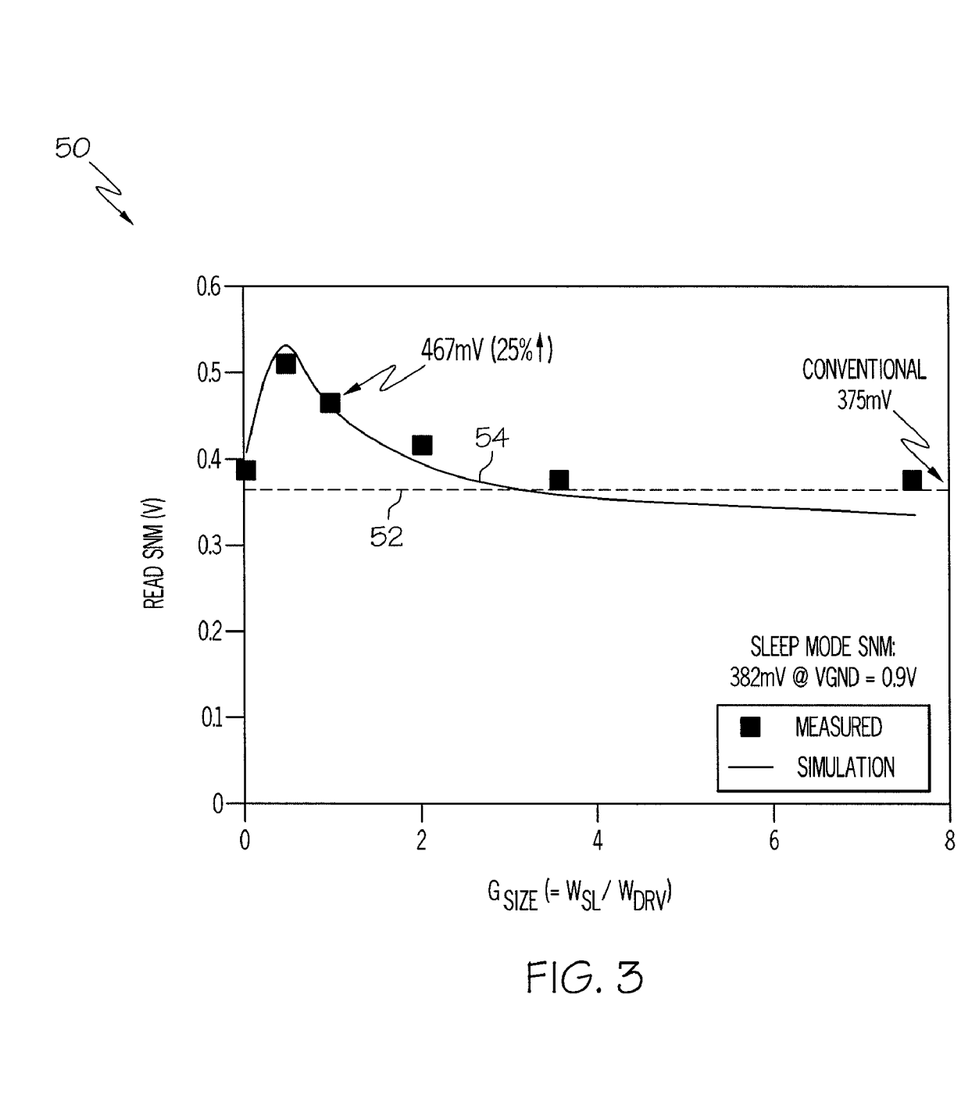
FIG. 3 is a graph illustrating the static noise margin for the memory cell of FIG. 1 having differing sleep transistor size ratios.

Referring now to FIG. 3, a graph 50 illustrating the read static noise ratio values for differing size ratios, Gsize, of sleep transistor-to-driver transistor is shown. In conventional memory devices, the sleep transistor is selected based on performance issues such as speed. A line 52 illustrates the typical read static noise margin values, about 0.38, for conventional memory devices. A line 54 illustrates the read static noise values of memory devices having various size ratio values. As illustrated in FIG. 3, a memory device having a sleep transistor-to-driver transistor size ratio of less than about 3.0 has an increased read static noise margin value. Accordingly, in one embodiment, the size ratio for the sleep transistor 14 is selected to be less than about 3.0. In particular, the size ratio may be selected to be less than about 2.0. More particularly, the size ratio may be selected to be about 1.0 to provide an increase in the read static noise margin of about 25% relative to conventional memory cells. Smaller size ratios may also be selected for increased read static noise margin values. Once the size ratio has been selected based on the associated read static noise margin value, the size of the sleep transistor 14 may be determined based on the size ratio. In some embodiments, the size ratio may be a normalized value. In such embodiments, the size of the sleep transistor 14 determined based on the size ratio may be multiplied by the number of memory cells to which the sleep transistor 14 is coupled to determine the final size of the sleep transistor 14.

Figure 4:
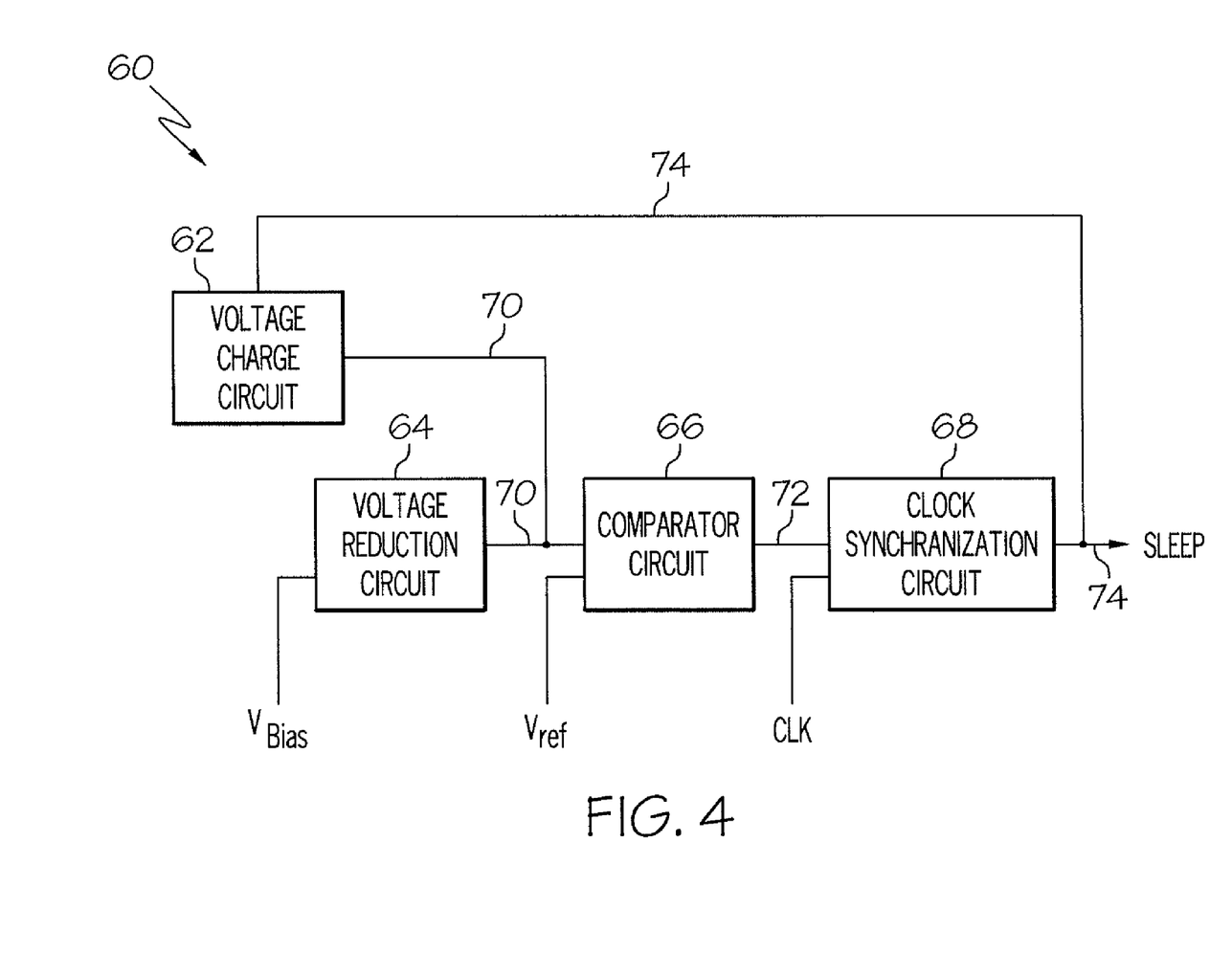
FIG. 4 is a block diagram of a circuit for reducing the current leakage in a memory device.

Referring now to FIG. 4, a leakage reduction circuit 60 for reducing the current leakage in a memory device includes a voltage charge circuit 62, a voltage reduction circuit 64, a comparator circuit 66, and a clock synchronization circuit 68. The voltage charge circuit 62 is coupled to the voltage reduction circuit 64 and the comparator circuit 66 via an electrical interconnect 70. The comparator 66 is electrically coupled to the clock synchronization circuit 68 via an electrical interconnect 72. The clock synchronization circuit 68 is also coupled to the voltage charge circuit 62 via an electrical interconnect 74. The electrical interconnects 70, 72, 74 may be any type of electrical interconnects including, for example, polysilicon lines, printed circuit board traces, wires, or any other type of electrical interconnect.

In operation, the voltage charge circuit 62 produces a voltage. The voltage is based on a previous sleep signal generated by the clock synchronization circuit 68. The voltage produced by the charge circuit 62 is supplied to the comparator circuit 66 and the voltage reduction circuit 64 via the interconnect 70. The voltage reduction circuit 64 reduces the voltage based on the leakage current of the memory cell(s). In one embodiment, the voltage reduction circuit 64 includes a transistor. The transistor is biased in the sub-threshold region and, therefore, any reduction of the voltage produced by the circuit 62 is a result of the leakage current of the sub-threshold biased transistor. Because the circuit 60 is fabricated on the same substrate as the memory cell, the voltage reduction circuit experiences any production variation and/or operational variations such as temperature variations that are experienced by the transistors of the memory cell(s). Accordingly, the current leakage of a transistor included in the circuit 64 tracks or mirrors the leakage current of the transistors of the memory cell(s) of the memory device. The comparator circuit 66 compares the voltage to a predetermined voltage threshold, Vref. Once the voltage reduction circuit 64 has reduced the voltage to a voltage level below the voltage threshold, the comparator circuit 66 produces an output signal on the interconnect line 72. The clock synchronization circuit 68 monitors the interconnect line 72 for the output signal from the comparator circuit 66. Once the output signal is received by the circuit 68, the circuit 68 produces a sleep signal on the interconnect line 74 on the next clock pulse. In this way, the sleep signal is synchronized with the system clock. The sleep signal produced on the interconnect line 74 is received by the voltage charge circuit 62, which produces another voltage after receiving the sleep signal and the voltage reduction process is repeated. In addition, the interconnect line 74 is coupled to a sleep transistor such as sleep transistor 14. The sleep transistor 14 and the mode of any coupled memory cells may, therefore, be controlled via the sleep signal. It should be appreciated that the clock synchronization circuit 68 may produce a SLEEP or notSLEEP signal as required by the sleep transistor and/or other circuitry. In addition, in one embodiment, the sleep signal is a sleep pulse signal.

Figure 5:
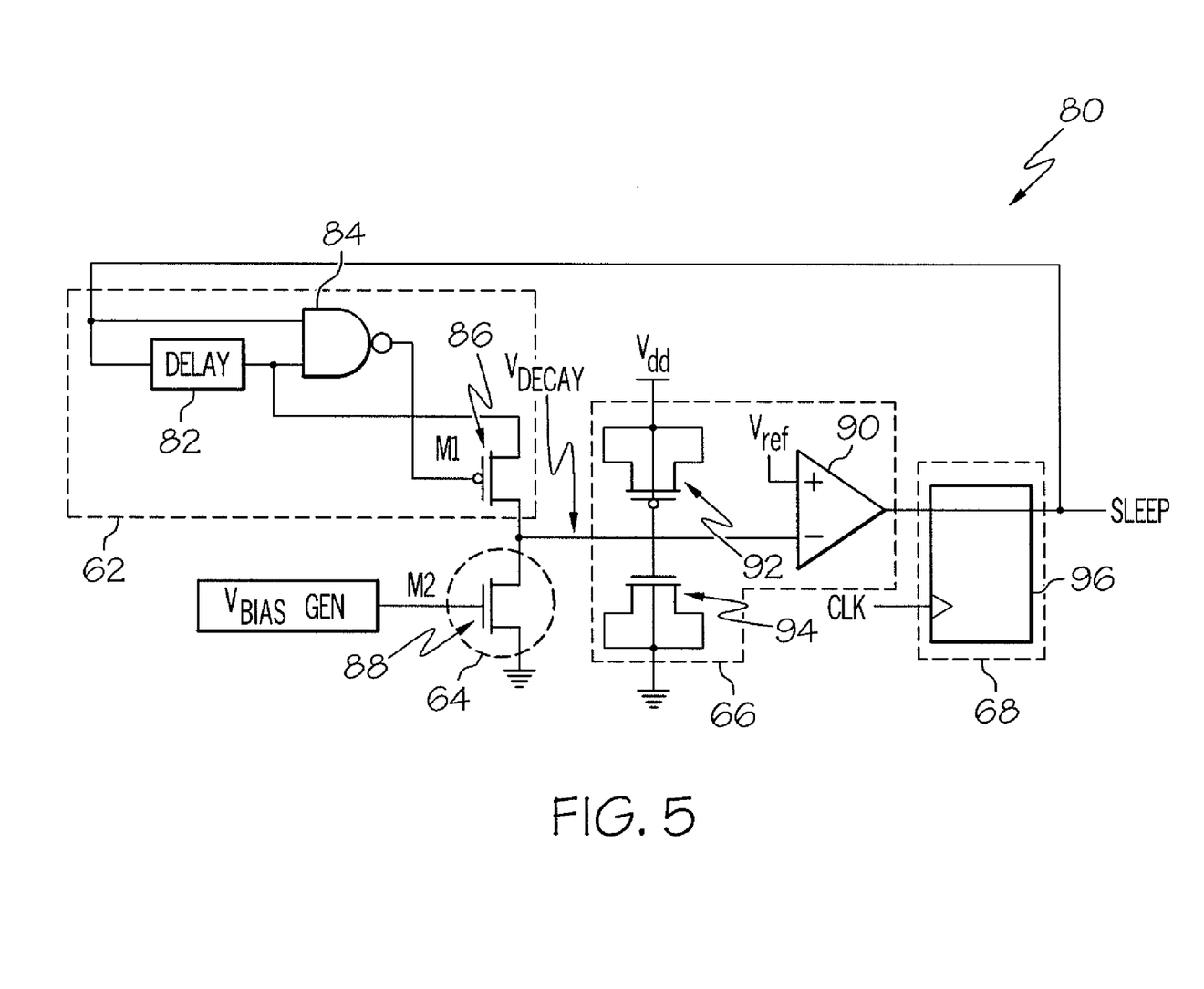
FIG. 5 is an illustrative schematic of one embodiment of the circuit of FIG. 4.

Referring now to FIG. 5, one particular embodiment of a leakage reduction circuit 80 is illustrated. In circuit 80, the voltage charge circuit 62 includes a delay device 82, a two-input terminal NAND gate 84, and a transistor 86. The delay device 82 and one input terminal of the NAND gate 84 receive the sleep signal produced by the clock synchronization circuit 68. The delay device 82 delays the sleep signal for a predetermined amount of time. After the predetermined amount of time has elapsed the sleep signal is supplied to the second input terminal of the NAND gate 84 and the drain terminal of the transistor 86. The output terminal of the NAND gate 84 is coupled to the gate terminal of the transistor 86. Once the NAND gate 84 receives the sleep signal on both input terminals, the NAND gate 84 produces an output signal on the output terminal. The output signal biases the transistor 86 (illustratively a PMOS transistor) causing the transistor 86 to supply a voltage on the source terminal of the transistor 86. In this way, the voltage charge circuit 62 periodically charges or supplies a voltage to the comparator circuit 66 and the voltage reduction circuit 64.

In circuit 80, the voltage reduction circuit 64 is embodied as a transistor 88. The transistor 88 has a drain terminal coupled to the voltage charge circuit 62 and the comparator circuit 66. The drain terminal receives the voltage produced by the voltage charge circuit 66. The source terminal of the transistor 88 is coupled to a reference voltage. A bias signal, Vbias, is applied to the gate of the transistor 88 so that the transistor 88 is biased in the sub-threshold region. In this way, any reduction of the voltage supplied by the circuit 62 is caused from the current leakage of the transistor 88. Because the circuit 80, and in particular the transistor 88, is fabricated on the same die and substrate as the memory cells and associated sleep transistor, any production variation and/or operational variations experienced by the transistors of the memory cells is also experiences by the transistor 88. Accordingly, the current leakage of the transistor 88 tracks or is otherwise substantially similar to the current leakage of the memory cell transistors. Therefore, as the current leakage of the memory cell transistors increases and decreases, the current leakage of the transistor 88 similarly increases and decreases causing an increased and decreased reduction of the voltage supplied by the circuit 62. In this way, the reduction of the voltage supplied by the circuit 62 is based on the leakage of the memory cell(s).

The comparator circuit 66 monitors the voltage supplied by the circuit 62. In circuit 80, the comparator circuit 66 includes an operational amplifier 90 configured as a comparator. The operational amplifier 90 has a positive input terminal and a negative input terminal. A predetermined voltage reference signal is supplied to the positive input terminal of the amplifier 90. The voltage produced by the circuit 62 and reduced by circuit 64 is supplied to the negative terminal of the amplifier 90. Once the voltage supplied to the negative terminal drops below the reference voltage supplied to the positive terminal, the operation amplifier 90 produces an output signal on an output terminal. The output terminal is coupled to the clock synchronization circuit 68. In addition, the comparator circuit 66 includes capacitance devices 92, 94. The devices 92, 94 stabilizes the voltage produced by the circuit 62 by reducing fluctuations in the voltage. Illustratively, the devices 92, 94 are transistors wired as capacitance devices, but in other embodiments of types of capacitance devices may be used such as capacitors. The capacitance device 92 is coupled to the supply voltage, Vdd, and the capacitance device 94 is coupled to the reference voltage.

In circuit 80, the clock synchronization circuit is embodied as a D type flip-flop 96. The flip-flop 96 includes a clock input receiving a system clock signal and an input terminal coupled to the comparator circuit 66 and receiving the output of the operational amplifier 90. When the flip-flop 96 receives the output signal from the amplifier 90, the flip-flop 96 produces an output signal, the sleep signal, at the next clock pulse received on the clock input terminal. In this way, the sleep signal is synchronized with the system clock. In addition, the sleep signal is supplied to the voltage charge circuit 62, which produces another voltage based on the received sleep signal. In this way, a periodic voltage is produced and subsequently reduced based on the current leakage of a sub-threshold biased transistor until it reaches a predetermined threshold at which time a clock synchronized sleep signal is generated.

Figure 6:
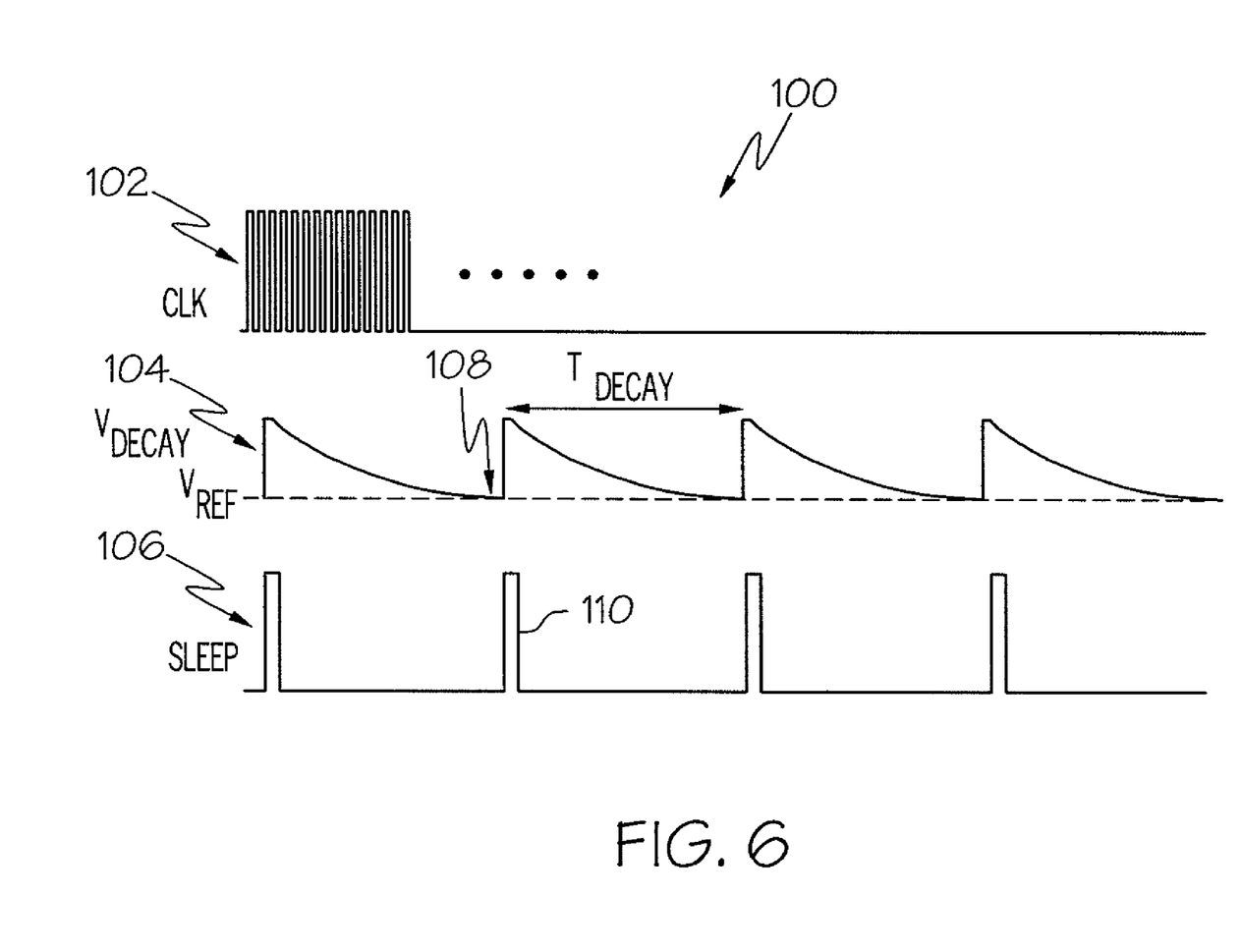
FIG. 6 is a timing diagram of the circuit of FIG. 5.

Referring now to FIG. 6, a timing diagram 100 for the leakage reduction circuit 80 is illustrated. The timing diagram 100 includes a clock signal 102, a voltage, Vdecay, signal 104, and a sleep signal 106. As discussed in detail above in regard to FIG. 5, the voltage charge circuit 62 produces a voltage, Vdecay. The voltage reduction circuit 64 reduces this voltage based on the current leakage of a sub-threshold biased transistor. Once the voltage signal, Vdecay, falls below a predetermined reference voltage, Vref, as illustrated at point 108, an output sleep signal 110 is produced. The sleep signal 110 is synchronous with the clock signal 102. The decay time, Tdecay, required for the voltage, Vdecay, to fall below the reference voltage, Vref, is determined by the current leakage of the transistor 88. As production variations and/or operational parameters change, the decay time, Tdecay, will also change. For example, as the memory device heats up, the current leakage of the transistor 88 (and of the memory cell transistors) will increase thereby causing the decay time, Tdecay, to decrease. Because the current leakage of the transistor 88 tracks or is otherwise similar to the current leakage of the transistors of the memory cell(s), the decay time, Tdecay, is likewise based on the current leakage of the memory cell(s). Accordingly, the leakage tracking capability of the circuit 80 provides an increased leakage power savings under varying operating conditions by placing the memory cells in sleep mode or otherwise turning off the memory cells more frequently at higher leakage conditions (e.g., high operating temperature conditions).

While the disclosure has been illustrated and described in detail in the drawings and foregoing description, such an illustration and description is to be considered as exemplary and not restrictive in character, it being understood that only illustrative embodiments have been shown and described and that all changes and modifications that come within the spirit of the disclosure are desired to be protected.

There are a plurality of advantages of the present disclosure arising from the various features of the methods, circuits, and devices described herein. It will be noted that alternative embodiments of the methods, circuits, and devices of the present disclosure may not include all of the features described yet still benefit from at least some of the advantages of such features. Those of ordinary skill in the art may readily devise their own implementations of the methods, circuits, and devices that incorporate one or more of the features of the present invention and fall within the spirit and scope of the present disclosure as defined by the appended claims.

The invention claimed is:

1. A leakage reduction circuit for reducing current leakage in a memory cell having a sleep transistor coupled thereto, the sleep transistor responsive to a sleep signal to place the memory cell in a sleep mode to reduce the current leakage of the memory cell, the leakage reduction circuit comprising:
   a voltage charge circuit producing a first voltage;
   a voltage reduction circuit coupled to the voltage charge circuit, the voltage reduction circuit reducing the first voltage based on a leakage current;
   a comparator circuit coupled to the voltage charge circuit and the voltage reduction circuit, the comparator circuit comparing the first voltage to a reference voltage and producing an output signal if the first voltage is lower than the reference voltage; and
   a synchronization circuit coupled to the comparator circuit and having an input receiving the output signal, the synchronization circuit producing the sleep signal based on the output signal and a clock signal.

2. The leakage reduction circuit of claim 1, wherein the voltage charge circuit has an input receiving the sleep signal produced by the synchronization circuit, the voltage charge circuit producing the first voltage in response to the sleep signal.

3. The leakage reduction circuit of claim 1, wherein the voltage charge circuit includes an electrical switch producing the first voltage in response to a delayed representation of the sleep signal.

4. The leakage reduction circuit of claim 1, wherein the voltage charge circuit includes:
   a delay circuit having an input receiving the sleep signal and an output producing a delayed sleep signal;
   a NAND gate having a first input receiving the sleep signal, a second input receiving the delayed sleep signal, and an output producing a biasing signal; and
   a transistor having a control input receiving the delayed sleep signal, a biasing signal input receiving the biasing signal, and an output producing the first voltage.

5. The leakage reduction circuit of claim 1, wherein the voltage reduction circuit includes a transistor producing the leakage current.

6. The leakage reduction circuit of claim 5, wherein the transistor is a metal oxide semiconductor transistor.

7. The leakage reduction circuit of claim 5, wherein the transistor has an input receiving a bias voltage, the bias voltage biasing the transistor in a sub-threshold region.

8. The leakage reduction circuit of claim 1, wherein the comparator circuit includes an operational amplifier configured as a comparator.

9. The leakage reduction circuit of claim 1, further including a number of capacitance devices for stabilizing the first voltage.

10. The leakage reduction circuit of claim 9, wherein the number of capacitance devices includes a number of transistors.

11. The leakage reduction circuit of claim 1, wherein the synchronization circuit includes a flip-flop having a signal input receiving the output signal produced by the comparator circuit, a clock input receiving the clock signal and an output producing the sleep signal.

12. The leakage reduction circuit of claim 11, wherein the flip-flop is a D-type flip-flop.

* * * * *